(12) United States Patent
Ting

(10) Patent No.: US 7,936,178 B2
(45) Date of Patent: May 3, 2011

(54) TEST PROBE

(75) Inventor: Wei-Fan Ting, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 12/545,869

(22) Filed: Aug. 24, 2009

(65) Prior Publication Data

US 2011/0012634 A1 Jan. 20, 2011

(30) Foreign Application Priority Data

Jul. 15, 2009 (TW) .............................. 98123974 A

(51) Int. Cl.
*G01R 31/00* (2006.01)
*G01R 1/067* (2006.01)

(52) U.S. Cl. ......... 324/755.11; 324/754.03; 324/755.01; 324/756.07; 257/48

(58) Field of Classification Search .......... 324/754–765
See application file for complete search history.

(56) References Cited

U.S. PATENT DOCUMENTS

| | | | | | |
|---|---|---|---|---|---|
| 4,480,223 | A | * | 10/1984 | Aigo | 324/752 |
| 4,678,865 | A | * | 7/1987 | Sherwin | 174/36 |
| 5,175,493 | A | * | 12/1992 | Langgard | 324/761 |
| 5,196,789 | A | * | 3/1993 | Golden et al. | 324/761 |
| 5,512,838 | A | * | 4/1996 | Roach | 324/754 |
| 5,557,214 | A | * | 9/1996 | Barnett | 324/754.1 |
| 2009/0224781 | A1 | * | 9/2009 | Aoyagi et al. | 324/754 |

* cited by examiner

*Primary Examiner* — Ha Tran T Nguyen
*Assistant Examiner* — Emily Y Chan
(74) *Attorney, Agent, or Firm* — CKC & Partners Co., Ltd.

(57) ABSTRACT

A test probe is provided. The test probe includes a group of shielding boards and two probe pins. The group of shielding boards has two opposite surfaces. The group of shielding boards includes at least two insulation boards and at least one metal board. The metal board is formed between the two insulation boards. The two probe pins are formed on the two surfaces of the group of shielding boards and have a distance between each other.

8 Claims, 2 Drawing Sheets

TEST PROBE

RELATED APPLICATIONS

This application claims priority to Taiwan Application Serial Number 98123974, filed Jul. 15, 2009, which is herein incorporated by reference.

BACKGROUND

1. Field of Invention

The present invention relates to a test device, and more particularly to a device for testing an electrical variable.

2. Description of Related Art

When a test probe is used to detect an impedance of a test object, it requires excellent accuracy. In common test probes, a coupling phenomenon is easily induced by a small distance between head ends of probe pins of the test probes, such that an impedance of the test probes is changed. Such a design can easily affect the impedance value of the test object, and hence cannot obtain an accurate detection result.

Therefore, how to design a novel test probe with keeping probe pins thereof spaced at a distance to prevent a coupling phenomenon from affecting a detection result has become an urgent problem to be resolved in the art.

SUMMARY

Therefore, according to one aspect of the present invention, a test probe is provided. The test probe includes a group of shielding boards and two probe pins. The group of shielding boards has two opposite surfaces and includes at least two insulation boards and at least one metal board. The metal board is formed between the two insulation boards. The two probe pins are formed on the two surfaces of the group of shielding boards and have a distance between each other.

The advantages of applying the embodiments of the present invention include keeping probe pins spaced at a suitable distance from each other by using a group of shielding boards, so as to prevent a coupling phenomenon, thereby easily achieving the aforementioned object.

BRIEF DESCRIPTION OF THE DRAWINGS

For the purpose that the aforementioned objects, features, advantages, and embodiments of the present invention can be more obviously and easily understood, the accompanying figures are explained as below.

DESCRIPTION OF THE PREFERRED EMBODIMENTS

Figure 1A:
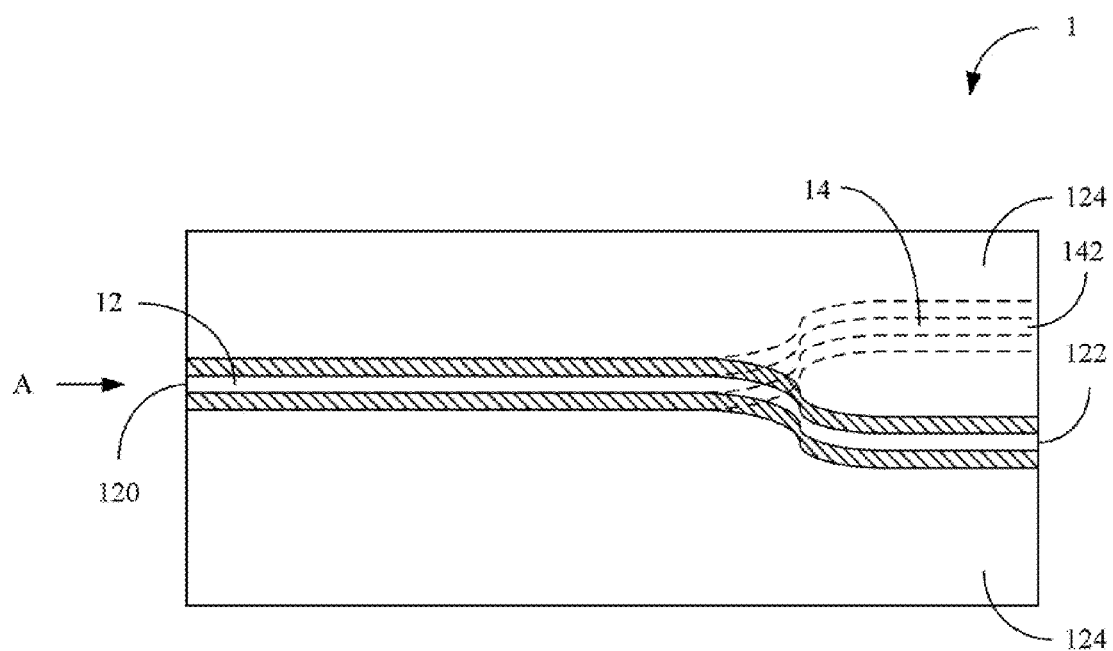
FIG. 1A is a top view of a test probe according to one embodiment of the present invention.
Figure 1B:
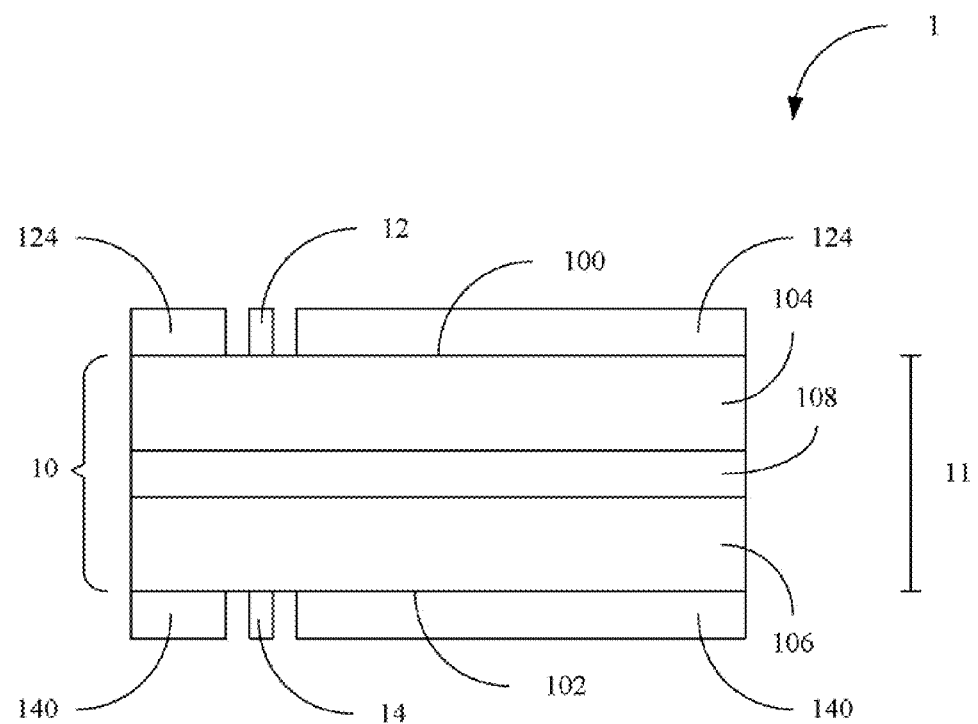
FIG. 1B is a side view of the test probe of FIG. 1A viewed from the direction A.

Referring to FIG. 1A, FIG. 1A is a top view of a test probe 1 according to one embodiment of the present invention. Please simultaneously refer to FIG. 1B, which is a side view of the test probe 1 viewed from the direction A. The test probe 1 includes a group of shielding boards 10 and two probe pins 12 and 14. The group of shielding boards 10 has two opposite surfaces 100 and 102. In this embodiment, the group of shielding boards 10 includes two insulation boards 104 and 106, and one metal board 108, wherein the metal board 108 is formed between the two insulation boards 104 and 106. In this embodiment, in order to achieve the effect of insulation, the material of the insulation boards is glass fiber, and the material of the metal board is copper.

Probe pins 12 and 14 are respectively formed on the two surfaces 100 and 102, and keep a distance 11 between each other by using the group of shielding boards 10. Each of the probe pins 12 and 14 respectively includes a head end and a tail end, wherein the probe pin 12, under which is located the probe pin 14, is drawn by a solid line in FIG. 1. Take the probe pin 12 as an example. The head end 120 is used for contacting a test object (not shown), and the tail end 122 is used for electrically connecting to an input terminal of a test device (the tail end 142 shown by dash lines is connected to another input terminal of the test device). Therefore, the probe pins 12 and 14 can contact the test object via the head ends, and then the test device can sense a value of an electrical variable of the test object. A coupling effect between the probe pins 12 and 14 can be reduced through a shielding effect of the metal board 108 and an insulation effect of the insulation boards 104 and 106 to prevent from affecting a detection result. In this embodiment, two surface metal layers 124 and 140 are further and respectively formed on the two surfaces 100 and 102 of the group of shielding boards 10, and along peripherals of the probe pins 12 and 14, wherein the surface metal layer 124 is spaced from the peripheral of the probe pin 12 at a distance and the surface metal layer 140 is spaced from the peripheral of the probe pin 14 at another distance. The material of the surface metal layers 124 and 140 is copper for providing a preferred shielding effect to the probe pins 12 and 14.

Figure 2:
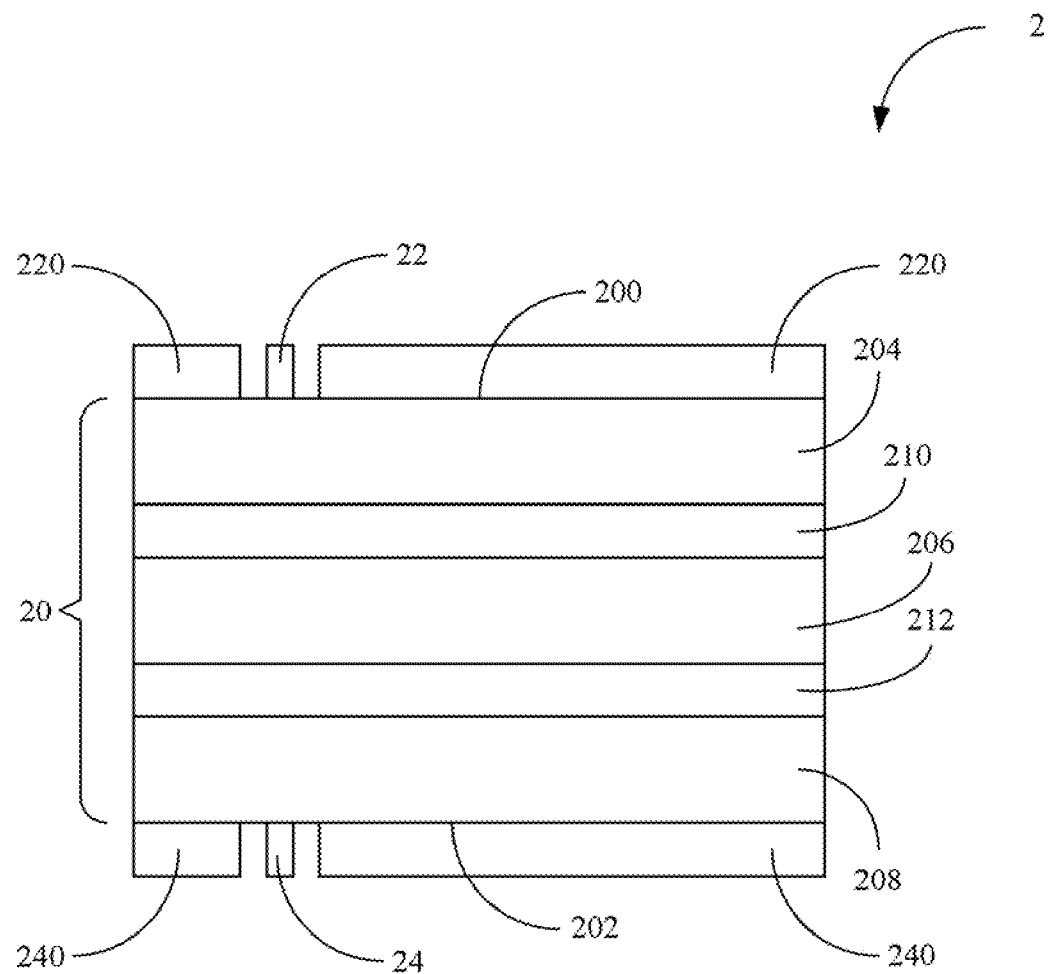
FIG. 2 is a side view of a test probe 2 according to another embodiment of the present invention.

In another embodiment of the present invention, the group of shielding boards can be composed of three insulation boards and two metal boards. Please refer to FIG. 2, which is a side view of, a test probe 2 according to another embodiment of the present invention. The test probe 2 includes a group of shielding boards 20 and two probe pins 22 and 24. The group of shielding boards 20 has two opposite surfaces 200 and 202. In this embodiment, the group of shielding boards 20 includes three insulation boards 204, 206 and 208, and two metal boards 210 and 212, wherein the metal board 210 is formed between the insulation boards 204 and 206, and the metal board 212 is formed between the insulation boards 206 and 208. Two surface metal layers 220 and 240 are further and respectively formed on the two surfaces 200 and 202 of the group of shielding boards 20, and along peripherals of the probe pins 22 and 24, wherein the surface metal layer 220 is spaced from the peripheral of the probe pin 22 at a distance and the surface metal layer 240 is spaced from the peripheral of the probe pin 24 at another distance. The material of the surface metal layers 220 and 240 is copper for providing a preferred shielding effect to the probe pins 22 and 24. In this embodiment, the aspect of two metal boards is used to provide a preferred shielding effect for preventing the probe pins 22 and 24 from a coupling effect.

Although the present invention is disclosed with embodiments as above, it is not used to limit the present invention, and any one skilled in the art can make various changes and modifications without departing from the spirit and range of the present invention. Therefore, the contents of the present invention under protection depend on the following claims.

What is claimed is:

1. A test probe comprising:
   a group of shielding boards having two opposite surfaces, the group of shielding boards comprising:
      at least two insulation boards; and at least one metal board formed between the two insulation boards;

two probe pins respectively formed on the two opposite surfaces of the group of shielding boards and having a distance between each other; and two surface metal layers respectively formed on the two opposite surfaces of the group of shielding boards, and along peripherals of the two probe pins, wherein each of the two surface metal layers is spaced from the peripheral of the probe pin located on the surface of the group of shielding boards corresponding thereto at a distance.

2. The test probe of claim 1, wherein the group of shielding boards is substantially composed of two insulation boards and one metal board.

3. The test probe of claim 1, wherein the group of shielding boards is substantially composed of three insulation boards and two metal boards.

4. The test probe of claim 1, wherein the material of the at least two insulation boards is glass fiber.

5. The test probe of claim 1, wherein the material of the at least one metal board is copper.

6. The test probe of claim 1, wherein each of the probe pins comprises a head end for contacting a test object and a tail end for electrically connecting to a test device.

7. The test probe of claim 1, wherein the material of the probe pins is copper.

8. The test probe of claim 1, wherein the material of the surface metal layers is copper.

* * * * *